US009006905B2

(12) United States Patent
Nakamura

(10) Patent No.: US 9,006,905 B2
(45) Date of Patent: Apr. 14, 2015

(54) SEMICONDUCTOR DEVICE WITH THROUGH SILICON VIA AND ALIGNMENT MARK

(71) Applicant: Elpida Memory, Inc., Chuo-ku (JP)

(72) Inventor: Nobuyuki Nakamura, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 14/196,560

(22) Filed: Mar. 4, 2014

(65) Prior Publication Data

US 2014/0183705 A1 Jul. 3, 2014

Related U.S. Application Data

(63) Continuation of application No. 13/427,960, filed on Mar. 23, 2012, now Pat. No. 8,692,384.

(30) Foreign Application Priority Data

Apr. 8, 2011 (JP) ................................. 2011-086330

(51) Int. Cl.
*H01L 23/48* (2006.01)
*H01L 21/683* (2006.01)
(Continued)

(52) U.S. Cl.
CPC ............. *H01L 23/544* (2013.01); *H01L 21/563* (2013.01); *H01L 21/6836* (2013.01); *H01L 21/76898* (2013.01); *H01L 23/3128* (2013.01); *H01L 23/3171* (2013.01); *H01L 23/481* (2013.01); *H01L 24/04* (2013.01); *H01L 24/11* (2013.01); *H01L 24/13* (2013.01); *H01L 24/14* (2013.01); *H01L 24/16* (2013.01); *H01L 24/73* (2013.01); *H01L 24/81* (2013.01); *H01L 25/0657* (2013.01); *H01L 25/50* (2013.01);
*H01L 2221/68327* (2013.01); *H01L 2221/6834* (2013.01); *H01L 2221/68372* (2013.01); *H01L 2223/54426* (2013.01); *H01L 2224/03002* (2013.01); *H01L 2224/0401* (2013.01); *H01L 2224/05572* (2013.01); *H01L 2224/05599* (2013.01); *H01L 2224/05647* (2013.01); *H01L 2224/05666* (2013.01); *H01L 2224/11005* (2013.01); *H01L 2224/1146* (2013.01); *H01L 2224/11462* (2013.01); *H01L 2224/1147* (2013.01); *H01L 2224/13009* (2013.01); *H01L 2224/13021* (2013.01); *H01L 2224/13022* (2013.01); *H01L 2224/13082* (2013.01); *H01L 2224/13083* (2013.01); *H01L 2224/13099* (2013.01); *H01L 2224/13111* (2013.01);
(Continued)

(58) Field of Classification Search
None
See application file for complete search history.

(56) References Cited

U.S. PATENT DOCUMENTS 8,692,384 B2 * 4/2014 Nakamura .................... 257/774
2009/0108464 A1 4/2009 Uchiyama
(Continued)

FOREIGN PATENT DOCUMENTS

JP 2005-217071 8/2005

*Primary Examiner* — Dung A. Le
(74) *Attorney, Agent, or Firm* — Young & Thompson

(57) ABSTRACT

A semiconductor device with a semiconductor substrate having a first surface and an opposite-facing second surface, a through electrode electrically connected to the semiconductor element and penetrating the semiconductor substrate from the first surface to the second surface, and a conductor, not electrically connected to the semiconductor element, penetrating the semiconductor substrate from the first surface to the second surface, where the through electrode and the conductor have different shapes in plan view.

20 Claims, 11 Drawing Sheets

(51) Int. Cl.
    *H01L 21/768*    (2006.01)
    *H01L 23/544*    (2006.01)
    *H01L 25/065*    (2006.01)
    *H01L 25/00*    (2006.01)
    *H01L 21/56*    (2006.01)
    *H01L 23/31*    (2006.01)
    *H01L 23/00*    (2006.01)

(52) U.S. Cl.
CPC ............. *H01L2224/13144* (2013.01); *H01L 2224/13147* (2013.01); *H01L 2224/13155* (2013.01); *H01L 2224/14181* (2013.01); *H01L 2224/16145* (2013.01); *H01L 2224/16146* (2013.01); *H01L 2224/16225* (2013.01); *H01L 2224/73204* (2013.01); *H01L 2224/81132* (2013.01); *H01L 2225/06513* (2013.01); *H01L 2225/06517* (2013.01); *H01L 2225/06544* (2013.01); *H01L 2225/06565* (2013.01); *H01L 2924/00014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01074* (2013.01); *H01L 2924/01079* (2013.01); *H01L 2924/014* (2013.01); *H01L 2924/15311* (2013.01)

(56) References Cited

U.S. PATENT DOCUMENTS

| | | |
|---|---|---|
| 2010/0297827 A1 | 11/2010 | Miyazaki |
| 2012/0069685 A1 | 3/2012 | Ide et al. |
| 2012/0320496 A1 | 12/2012 | Shin et al. |

* cited by examiner

SEMICONDUCTOR DEVICE WITH THROUGH SILICON VIA AND ALIGNMENT MARK

CROSS REFERENCE TO RELATED APPLICATIONS

This application is a continuation of U.S. application Ser. No. 13/427,960 filed on Mar. 23, 2012 and issued as U.S. Pat. No. 8,692,384, which claims priority from Japanese patent application No. 2011-086330, filed on Apr. 8, 2011, the disclosure of which is incorporated herein in its entirety by reference.

BACKGROUND OF THE INVENTION

1. Field of the Invention

The present invention relates to a semiconductor device having a conductor usable for registration and a method for fabricating a semiconductor device.

2. Description of the Related Art

In recent, with the downsizing of electronic devices or the provision of higher functionalities for electronic devices, a CoC (Chip on Chip) semiconductor device has been developed, including a chip stacked body formed of a plurality of semiconductor chips stacked on each other. In the CoC semiconductor device, the registration of semiconductor chips, that is, the alignment of semiconductor chips is performed in stacking semiconductor chips on each other.

FIGS. 2B and 3 in JP2005-217071A disclose alignment marks for use in aligning semiconductor chips. A semiconductor chip described in JP2005-217071A is a chip for a multichip semiconductor device having two or more conductive through plugs. One or more plugs among a plurality of through plugs are used for alignment marks. In other words, the alignment mark is formed of the same conductive member as the conductive member of the through plug, a metal material, for example. This alignment mark can be identified on the front and back surface of the chip. Thus, the alignment mark can be fabricated by the same process steps as the process steps for the through plug.

The alignment mark described in JP2005-217071A is fabricated by the same process steps as the process steps for the through plug. Therefore, the alignment mark is made of the same metal material as the metal material of the through plug, copper, for example. The inventor found that the characteristics of a semiconductor element formed on a semiconductor substrate sometimes deteriorate when metal atoms forming an alignment mark diffuse into the semiconductor substrate.

For example, in the case where a semiconductor chip is a memory chip like a DRAM, electric charges stored in a capacitor as a semiconductor element tend to leak which is caused by metal impurity in a semiconductor substrate. Thus, the data hold time of the DRAM is shortened.

Therefore, in a semiconductor chip including alignment marks formed of a conductive member, it is desirable to suppress deterioration of device characteristics caused by diffusion of atoms that form the conductive member.

SUMMARY

In one embodiment, a semiconductor device includes: a semiconductor substrate having a first surface and a second surface located opposite to each other in a thickness direction; a semiconductor element formed on the first surface of the semiconductor substrate; a through electrode penetrating the semiconductor substrate from the first surface to the second surface and electrically connected to the semiconductor element; a conductor penetrating the semiconductor substrate from the first surface to the second surface and not electrically connected to the semiconductor element; and an insulating separator penetrating the semiconductor substrate from the first surface to the second surface and formed in a ring so as to surround the conductor.

In another embodiment, a semiconductor device includes: a plurality of semiconductor chips stacked on each other, each of the plurality of semiconductor chips having a semiconductor substrate and a wiring layer; a through electrode penetrating the semiconductor substrate in a thickness direction and electrically connected to each other between the semiconductor chips adjacent to each other; a conductor penetrating the semiconductor substrate in the thickness direction and not electrically connected between the other semiconductor chips; and an insulating separator penetrating the semiconductor substrate in the thickness direction and formed in a ring so as to surround the conductor.

In other embodiment, a method for fabricating a semiconductor device, comprising: preparing a first semiconductor chip having a conductor and a insulating separator, the conductor penetrating the first semiconductor chip in a thickness direction and being not electrically connected to any element formed on the first semiconductor chip, the insulating separator penetrating the first semiconductor chip in the thickness direction and being formed in a ring so as to surround the conductor; aligning a second semiconductor chip with the first semiconductor chip by using the conductor of the first semiconductor chip; and stacking the second semiconductor chip on the first semiconductor chip.

According to the semiconductor devices in the foregoing configurations and the method for fabricating the same, it is possible to use the conductor not electrically connected to the semiconductor element for an alignment mark. Moreover, the ring-shaped insulating separator surrounding the conductor prevents atoms that form the conductor from diffusing into the semiconductor substrate. Thus, it is possible to suppress the deterioration of the characteristics of a semiconductor element caused by the diffusion of atoms.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
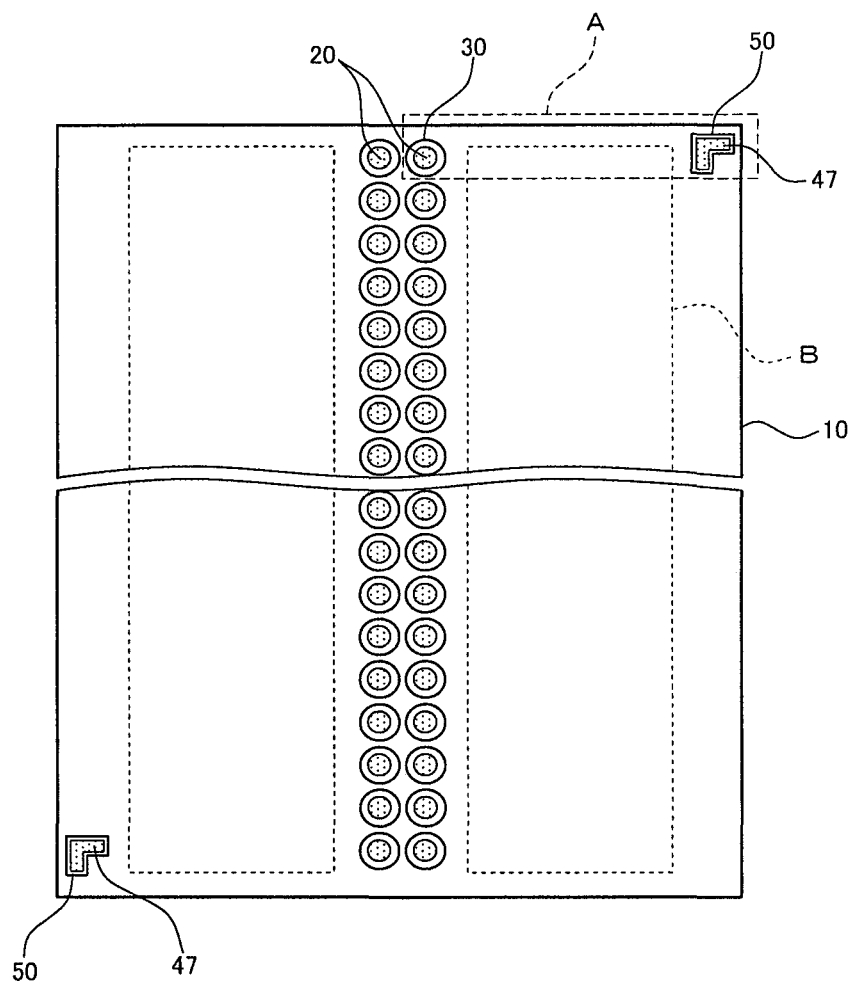
FIG. 1 is a plan view schematically illustrating a semiconductor chip according to a first embodiment.
Figure 2:
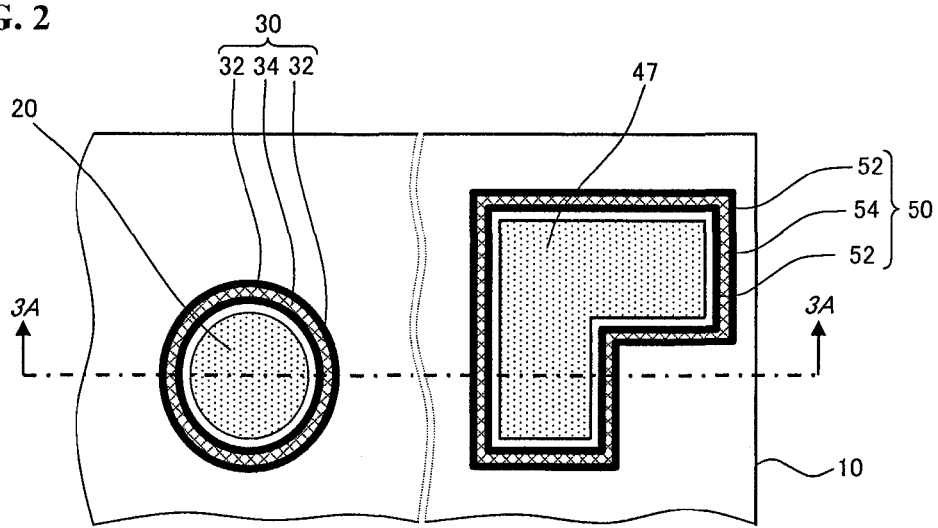
FIG. 2 is a schematic diagram illustrating the configurations of portions around a through electrode and an alignment mark part in the semiconductor chip according to the first embodiment.
Figure 3:
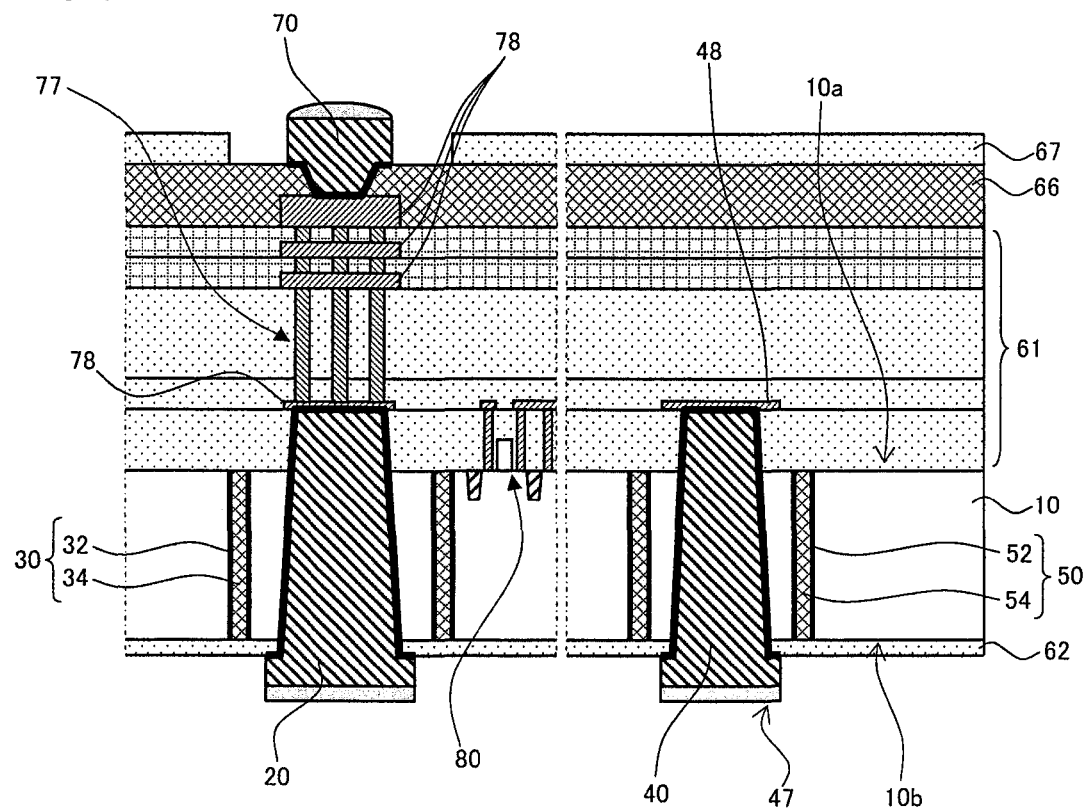
FIG. 3 is a cross sectional view illustrating the semiconductor chip along line 3A-3A shown in FIG. 2.

FIG. 1 is a plan view schematically illustrating a semiconductor chip according to a first embodiment. FIG. 2 is a schematic enlarged diagram illustrating region A shown in FIG. 1. FIG. 3 is a cross sectional view illustrating the semiconductor chip along line 3A-3A shown in FIG. 2.

The semiconductor chip has semiconductor substrate 10, through electrode 20 penetrating semiconductor substrate 10, alignment mark part 40, and cylindrical insulating films 30 and 50 of electrical insulating properties. For the material of semiconductor substrate 10, a semiconductor like a silicon substrate, for example, can be used. Semiconductor substrate 10 is formed with a functional element according to the function of the semiconductor chip, that is, semiconductor element 80. Functional element 80 is supplied with electric power from through electrode 20.

Functional element 80 is provided in device region B on a surface opposite one surface of the semiconductor substrate shown in FIG. 1. In the case where the semiconductor chip is a chip for a DRAM, functional element 80 is formed of a transistor and a capacitor disposed in series with the transistor.

Through electrode 20 and an alignment mark part, that is, metal post 40 are exposed in at least one surface of the semiconductor chip. In the example shown in FIG. 3, insulating layer 62 is formed on one surface of the semiconductor chip, in which through electrode 20 and alignment mark part 40 are exposed. For insulating layer 62, silicon nitride, for example, can be used. It is noted that this insulating layer 62 is not shown in FIGS. 1 and 2 for convenience.

Alignment mark part 40 penetrates semiconductor substrate 10. Alignment mark part 40 may be a metal post including the same metal material as the metal material of through electrode 20. Thus, alignment mark part 40 can be formed by the same process steps of fabricating through electrode 20. As a result, fabricating the semiconductor chip is facilitated. The end of the metal post forming alignment mark part 40 is exposed in the surface of the semiconductor chip, and used for alignment mark 47 for registration.

Alignment mark part 40 can be formed of a given conductive member. This conductive member 40 may penetrate the semiconductor substrate from first surface 10a to second surface 10b. Conductive member 40 is not electrically connected to semiconductor element 80.

First cylindrical insulating film 30 is formed on semiconductor substrate 10, and surrounds through electrode 20. Second cylindrical insulating film 50 is formed on semiconductor substrate 10, and surrounds alignment mark part 40. More specifically, cylindrical insulating film 30 or 50 surrounds through electrode 20 or alignment mark part 40 in a plane parallel with the surface of the semiconductor chip. In the first embodiment, insulating films 30 and 50 are disposed apart from through electrode 20 or alignment mark part 40. As described above, second insulating film 50 forms insulating separator 50 formed in a shape of a ring surrounding conductive member 40.

Preferably, both insulating films 30 and 50 may be made of the same material. Thus, both insulating films 30 and 50 can be fabricated by the same fabricating process steps.

Insulating separator 50 prevents atoms that form conductive member 40, particularly metal atoms, from diffusing into semiconductor substrate 10, device region B of the semiconductor substrate particularly. Therefore, it is possible to suppress the deterioration of characteristics of semiconductor element 80 caused by the diffusion of metal atoms. From a viewpoint of preventing metal atoms from diffusing, preferably, second insulating film 50 penetrates semiconductor substrate 10.

In order to prevent a metal material from diffusing, preferably, insulating films 30 and 50 include silicon nitride films 32 and 52. More preferably, insulating films 30 and 50 include silicon oxide films 34 and 54 whose surfaces are covered with these silicon nitride films 32 and 52. Moreover, insulating film 50 may include a poly-crystalline silicon film (polysilicon film). In this case, it is possible to further suppress the diffusion of metal atoms out of conductive member 40.

The semiconductor chip may have interlayer insulating layer 61, wiring layer 78, bump electrode 70, plug 77, and so on formed on semiconductor substrate 10. Bump electrode 70 is exposed in a surface opposite one surface of the semiconductor chip, in which through electrode 20 is exposed.

Wiring layer 78 may be formed in a plurality of levels. Interlayer insulating layer 61 is formed between wiring layer 78 in a certain level and wiring layer 78 adjacent thereto. Plug 77 extends in interlayer insulating layer 61. Plug 77 is electrically connected to through electrode 20, bump electrode 70, and wiring layer 78.

For the material of wiring layer 78, aluminum, tungsten, or the like can be used. Here, for an example, wiring layer 78 that makes contact with through electrode 20 was made of tungsten, and the other wiring layers 78 were made of aluminum. Moreover, preferably, etching stopper layer 48 that makes contact with alignment mark part 40 is formed at the same level at which wiring layer 78 that makes contact with through electrode 20 is located.

Insulating layer 67 made of polyimide and cover layer 66, for example, may be formed on one surface of the semiconductor chip on which bump electrode 70 is formed.

This semiconductor chip is preferably for use in a semiconductor device having semiconductor chips stacked on each other. End 47 of conductive member 40 that forms alignment mark part 40 is used for registration in stacking semiconductor chips on each other. A plurality of semiconductor chips may be the same kind of chips, or may be different kinds of chips. End 47 of conductive member 40 can be used for an alignment mark in aligning the semiconductor chip with a given member.

In the embodiment, end 47 of conductive member 40 is exposed only in one surface of the semiconductor chip. End 47 of conductive member 40 may be exposed in both surfaces of the semiconductor chip, not limited thereto. In this case, preferably, alignment mark part 40 exposed in one surface, on which bump electrode 70 is formed, is made of the same metal material as the metal material of wiring layer 78 that is located closest to the one surface. In the case where members to be aligned are on both sides of the chip, alignment mark parts 40 on both surfaces of the semiconductor chip are effective in cases where, for example, chips are to be stacked in three or more layers.

Alignment mark 47 can be recognized by an imaging device like a camera, for example. An image captured by the imaging device is subject to image processing, so that chips can be accurately aligned with each other by a computer. The shape of alignment mark part 40 is different from the shape of through electrode 20. Thus, the difference between alignment mark part 40 and through electrode 20 can be detected. Alignment mark part 40 may have any shape as long as the difference between alignment mark part 40 and through electrode 20 can be detected.

Figure 4A:
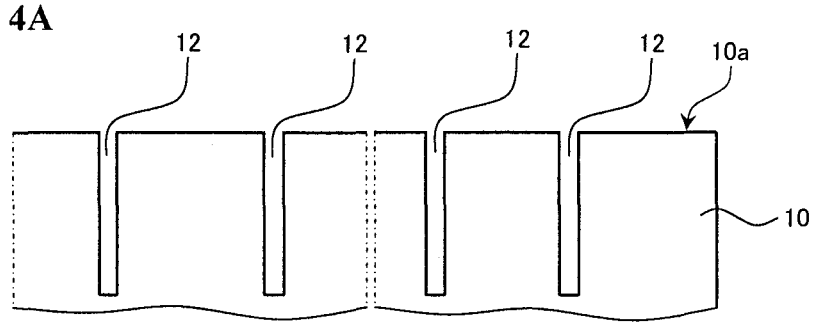
FIGS. 4A to 4C are diagrams illustrating the process steps of fabricating the semiconductor chip according to the first embodiment.

Next, exemplary process steps of fabricating the semiconductor chip will be described. In this example, silicon substrate 10 is prepared for a semiconductor substrate. As shown in FIG. 4A, frame-shaped trench 12 is formed on first surface 10a of semiconductor substrate 10 for forming insulating separator 50 in a ring.

Figure 4B:
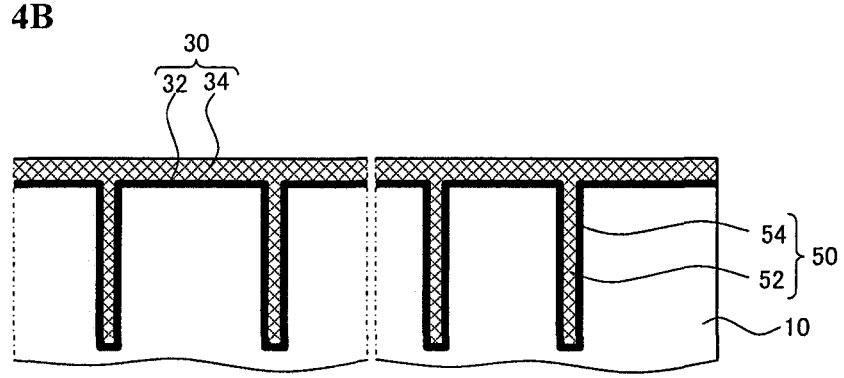

Subsequently, insulating films 30 and 50 are formed in trench 12. More specifically, as shown in FIG. 4B, silicon nitride films 32 and 52 are formed on the side wall of trench 12 and first surface 10a of semiconductor substrate 10. Subsequently, silicon oxide films 34 and 54 are formed on silicon nitride films 32 and 52 so as to bury the inside of trench 12. For silicon oxide films 34 and 54, an LP-TEOS (Low Pressure Si(OC$_2$H$_5$)$_4$) film, for example, can be used.

Figure 4C:
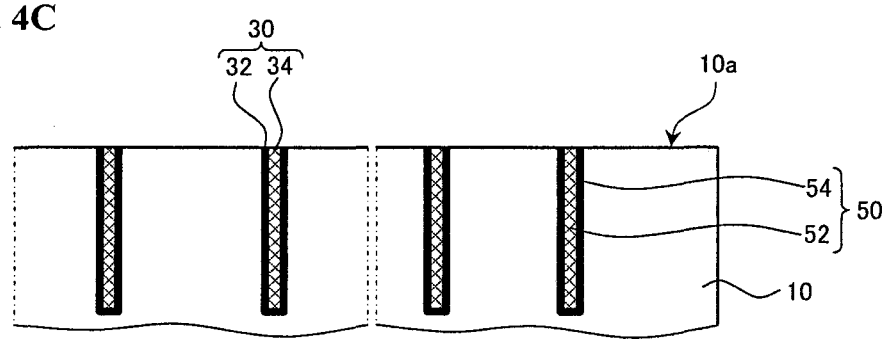

After that, as shown in FIG. 4C, silicon nitride films 32 and 52 and silicon oxide films 34 and 54 on first surface 10a of semiconductor substrate 10 are removed, and semiconductor substrate 10 is exposed. Silicon oxide films 34 and 54 and silicon nitride films 32 and 52 can be removed by etch back or chemical mechanical polishing (CMP), for example. Thus, insulating films 30 and 50 are formed in trench 12. Insulating film 30 near through electrode 20 and insulating film 50 near alignment mark part 40 can be collectively formed by the same process steps.

Subsequently, functional element 80 according to the function of the semiconductor chip, interlayer insulating layer 61, wiring layer 78, plug 77, cover layer 66, insulating layer 67, and so on are formed on first surface 10a of semiconductor substrate 10 (see FIG. 5A). Here, although wiring layer 78 is formed in a plurality of layers, wiring layer 78 may be formed in a single layer. Interlayer insulating layer 61 is formed between wiring layers 78 at each level. Insulating layer 67 is made of polyimide, for example. Insulating layer 67 is patterned as corresponding to a position at which bump electrode 70 is formed, that is, a position at which plug 77 is formed. It is noted that plugs or bump electrodes are unnecessary in a region in which alignment mark part 40 is to be formed.

In the case where the semiconductor chip is a chip for a DRAM, a transistor and a capacitor are formed for functional element 80. Moreover, preferably, etching stopper layer 48 is formed in a region in which alignment mark part 40 is to be formed in interlayer insulating layer 61.

Preferably, etching stopper layer 48 is formed at the position of wiring layer 78 that is located closest to first surface 10a of semiconductor substrate 10. More preferably, etching stopper layer 48 is made of the same metal material as the material for forming this wiring layer 78. In this example, tungsten was used for etching stopper layer 48.

Figure 5A:
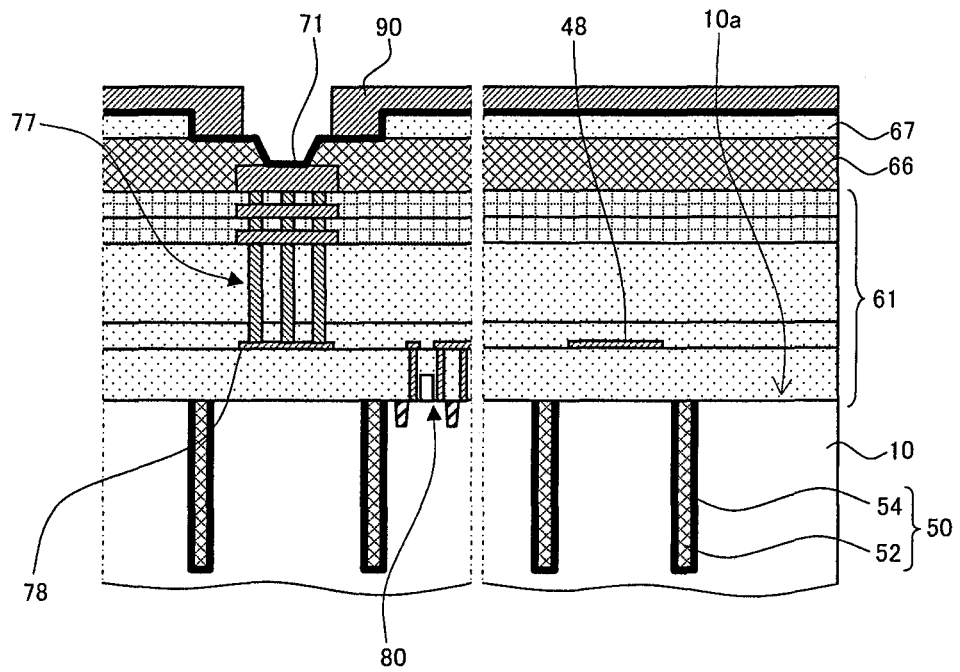
FIGS. 5A and 5B are diagrams illustrating steps performed subsequent to FIG. 4C.

As shown in FIG. 5A, seed layer 71 for precipitating plating is formed on plug 77 and insulating layer 67 by sputtering. For seed layer 71, a Cu/Ti layer, for example, can be used.

Subsequently, an electrode is formed on seed layer 71. Positive resist 90 in a predetermined shape is formed on seed layer 71 by photolithography, for example, and resist 90 is patterned in such a way that seed layer 71 on plug 77 is exposed from the resist. Subsequently, an electrode is formed on seed layer 71 exposed from resist 90 by electroplating.

The electrode can be formed in which metal post 72 made of copper, for example, is formed in the opening of resist 90, for example, and metal film 73 made of SnAg, for example, is formed on the surface of this metal post 72. In this manner, bump electrode 70 formed of seed layer 71, metal post 72, and metal film 73 can be formed. It is noted that the material for forming bump electrode 70 is not limited to the example described above.

Figure 5B:
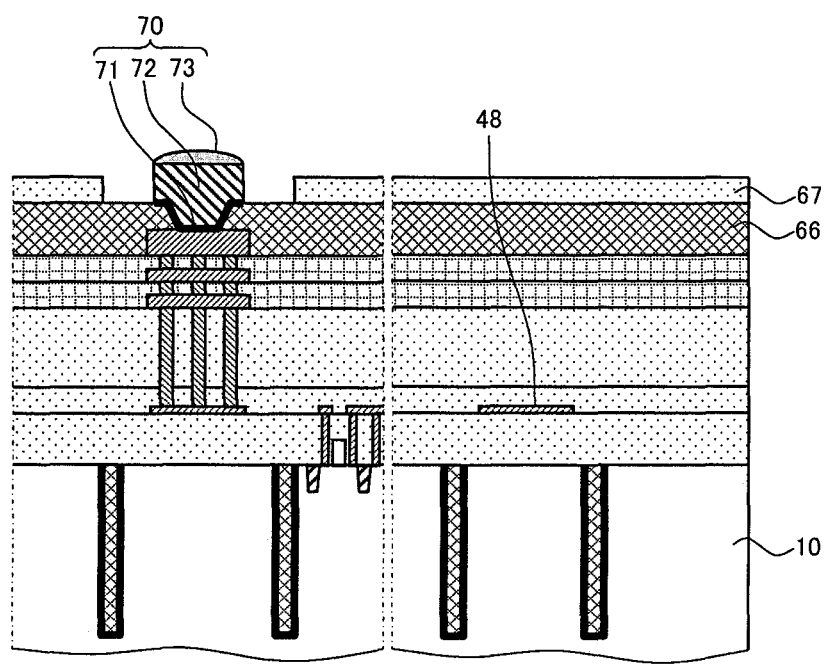

After forming bump electrode 70, resist 90 is removed, and seed layer 71 exposed in the surface of the semiconductor chip is removed. After removal, the temperature of bump electrode 70 is temporarily increased to melt only SnAg 22, and then reduced. Thus, as shown in FIG. 5B, the tip end of bump electrode 70 can be projected.

Figure 6A:
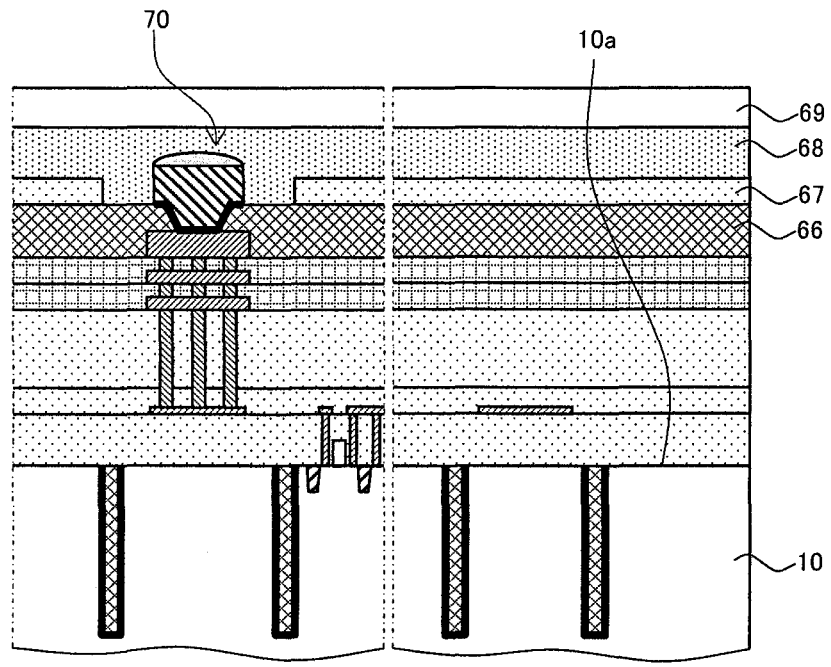
FIGS. 6A and 6B are diagrams illustrating steps performed subsequent to FIG. 5B.

Subsequently, as shown in FIG. 6A, support 69 is attached on bump electrode 70 and insulating layer 67 through intermediate layer 68 in order to process second surface 10b opposite first surface 10a of semiconductor substrate 10. For intermediate layer 68, a removable adhesive can be used such as an LTHC (Light to Heat Conversion) or UV-cure liquid adhesive, for example. For support 69, a wafer support system made of glass, for example, can be used.

Figure 6B:
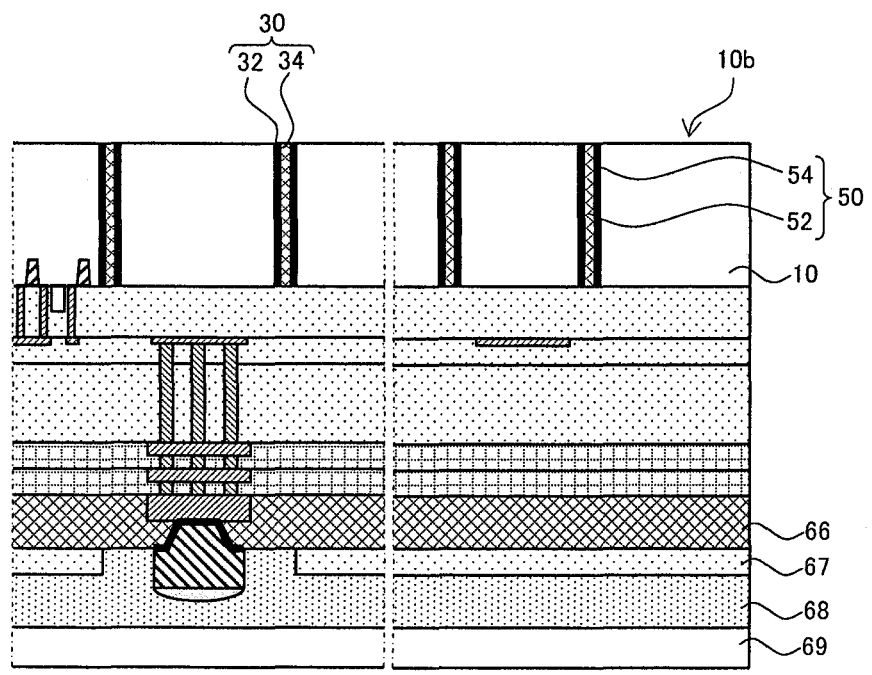

Subsequently, as shown in FIG. 6B, second surface 10b of semiconductor substrate 10 is ground until insulating films 30 and 50 are exposed in second surface 10b of semiconductor substrate 10. After grinding semiconductor substrate 10, second surface 10b of semiconductor substrate 10 is planarized by CMP, for example.

Figure 7A:
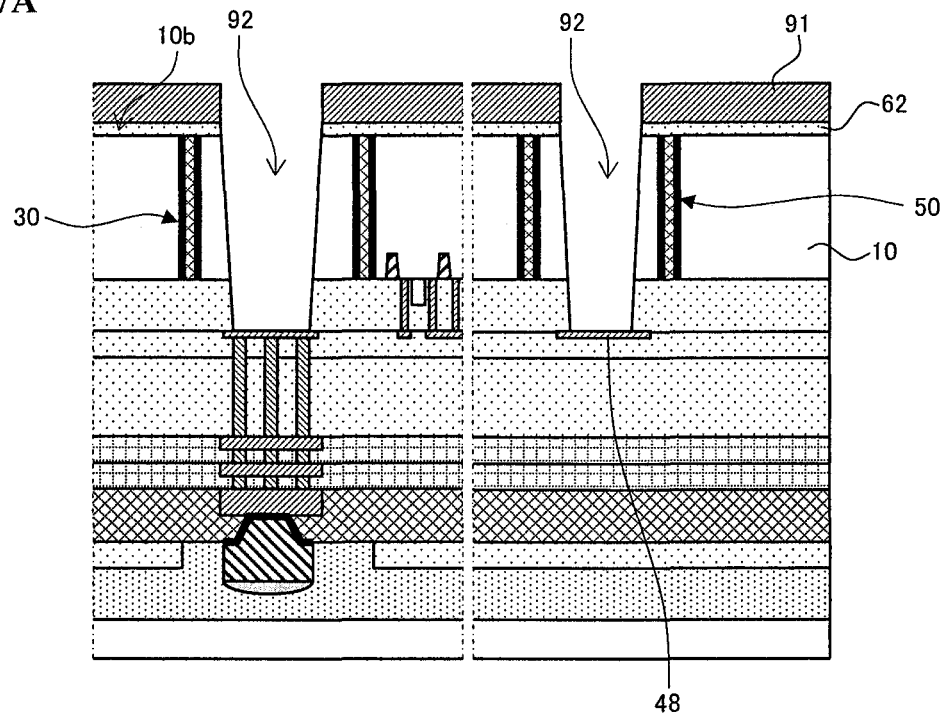
FIGS. 7A and 7B are diagrams illustrating steps performed subsequent to FIG. 6B.

Subsequently, as shown in FIG. 7A, hole 92 for the through electrode and the alignment mark part is formed on second surface 10b of semiconductor substrate 10. In this formation, preferably, insulating layer 62 made of silicon nitride, for example, is formed on second surface 10b of semiconductor substrate 10, resist 91 for forming hole 92 is applied, and then hole 92 is formed in semiconductor substrate 10. Silicon nitride for insulating layer 62 prevents a metal material, copper, for example, from diffusing out of second surface 10b of semiconductor substrate 10.

Hole 92 can be formed by dry etching, for example. Preferably, hole 92 is formed on the inner side of insulating films 30 and 50, and penetrates semiconductor substrate 10. In this formation, the depth of hole 92 is determined by etching stopper layer 48 described above. It is sufficient that etching stopper layer 48 is a material resistant against etching. In order to vary the shape of through electrode 20 from the shape of alignment mark part 40, the shape of the hole for through electrode 20 may be varied from the shape of the hole for alignment mark part 40.

Figure 7B:
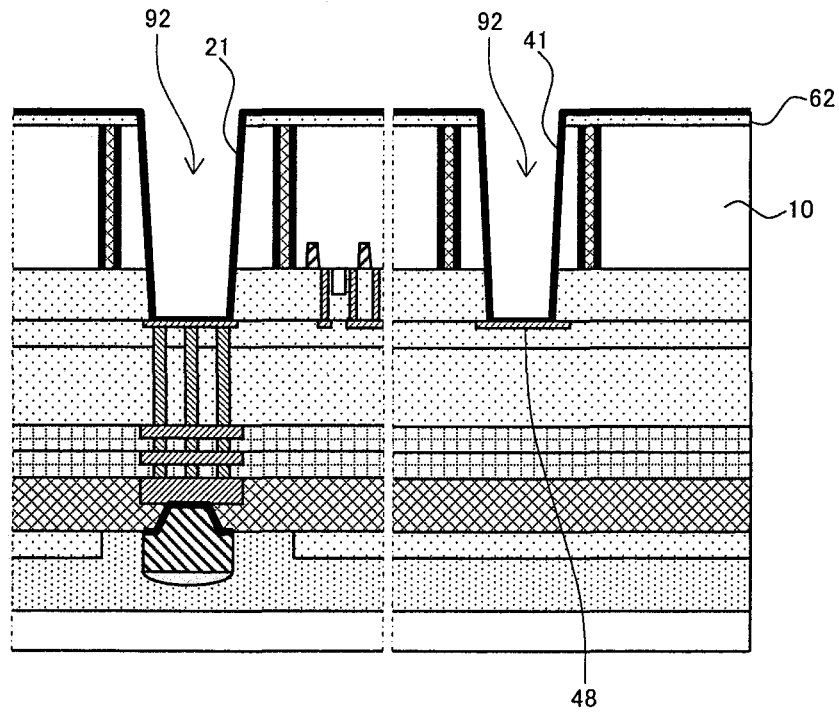

Subsequently, as shown in FIG. 7B, resist 91 is removed, and seed layers 21 and 41 are formed on the bottom face and side face of hole 92. Seed layers 21 and 41 can be formed of a Cu/Ti layer, for example. Seed layers 21 and 41 can be formed by sputtering, for example.

Figure 8:
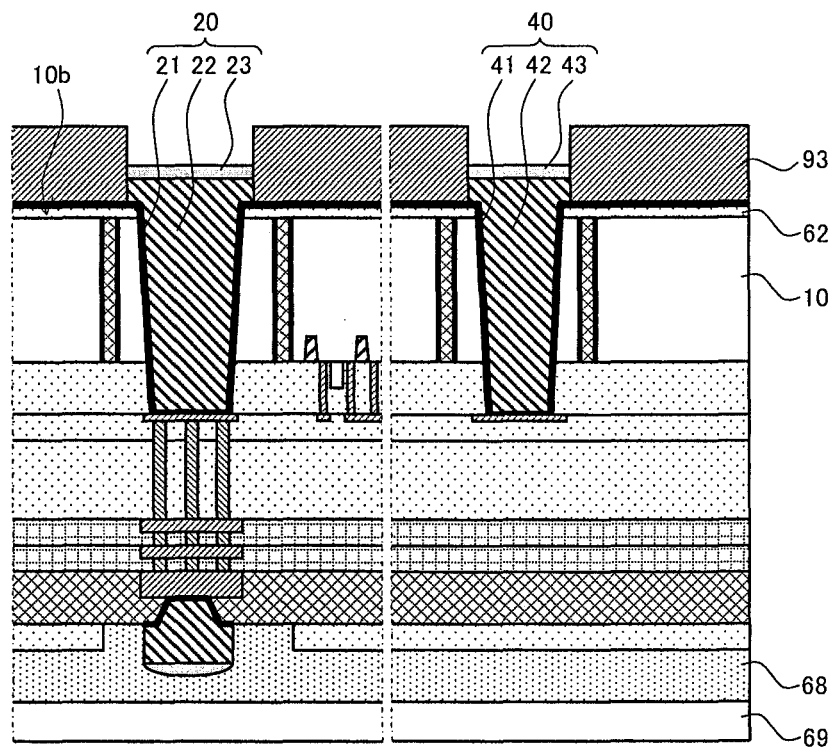
FIG. 8 is a diagram illustrating steps performed subsequent to FIG. 7B.

Subsequently, as shown in FIG. 8, through electrode 20 and alignment mark part 40 are formed in hole 92. More specifically, first, resist 93 for shaping through electrode 20 and alignment mark part 40 in a predetermined shape is formed on second surface 10b of semiconductor substrate 10. Subsequently, hole 92 is buried with metal materials 22 and 42 by electroplating, for example. For metal materials 22 and 42, copper, for example, can be used. Here, different metal films 23, 43 were formed on the surface of metal materials 22, 42 which are filled into hole 92. Metal films 23 and 43 can be made of Au/Ni by electroplating, for example. In this manner, conductive member 40 for through electrode 20 and alignment mark part 40 are formed, which are made of seed layers 21 and 41, metal materials 22, 42 and metal films 23, 43.

Through electrode 20 may be a through silicon via (TSV) that penetrates silicon as semiconductor substrate 10. Although alignment mark part 40 has a shape different from the shape of this through electrode 20, preferably, alignment mark part 40 has a similar structure.

Preferably, through electrode 20 and alignment mark part 40 are made of the same metal material, as described above. In this case, through electrode 20 and alignment mark part 40 can be formed at the same time by the same process steps.

Next, resist 93 is removed, and unnecessary seed layer 21 on insulating layer 62 is removed. Subsequently, intermediate layer 68 and support 69 are removed, so that the semiconductor chip shown in FIGS. 1 to 3 can be fabricated.

Figure 9:
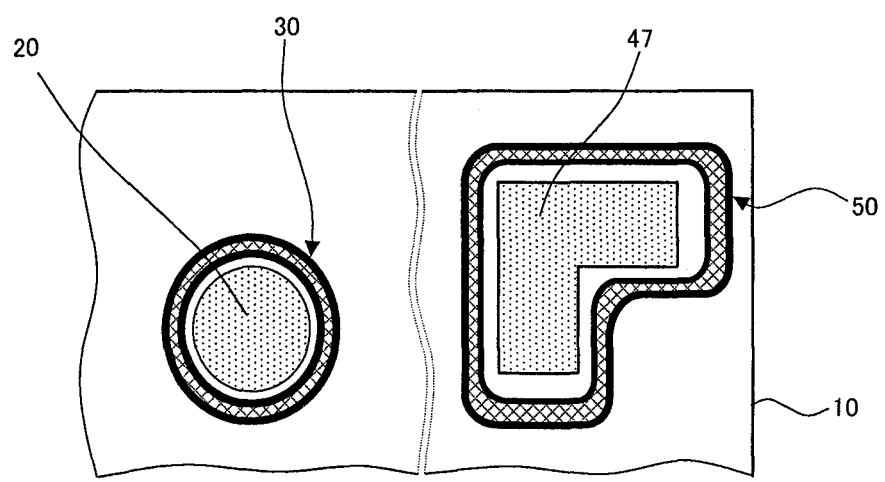
FIG. 9 is a schematic diagram illustrating the configurations of portions around a through electrode and an alignment mark part in a semiconductor chip according to a second embodiment.

In the following, a semiconductor chip according to a second embodiment will be described with reference to FIG. 9. FIG. 9 is a plan view illustrating the configurations of portions around a through electrode and an alignment mark part of the semiconductor chip according to the second embodiment.

In the semiconductor chip according to the second embodiment, the configurations of through electrode 20 and the alignment mark part for forming alignment mark 47 are the same as the configurations in the semiconductor chip according to the first embodiment. Insulating films 30 and 50 surround through electrode 20 or the alignment mark part. However, insulating film 50 for the insulating separator is formed of a smooth closed curve with no corners in a plane parallel with the surface of semiconductor substrate 10. Corners at which cracks tend to be produced are eliminated, so that it is possible to maintain the effect of insulating film 50 that prevents metal atoms from diffusing.

Figure 10:
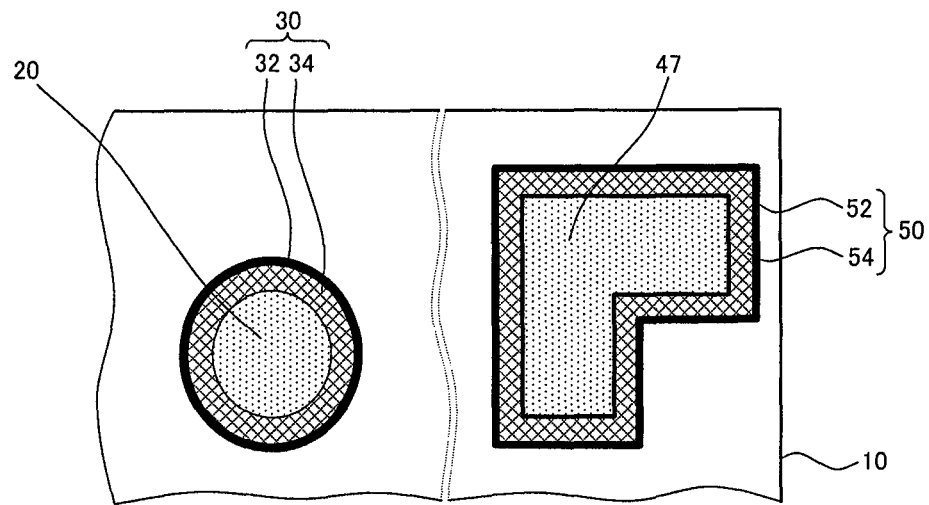
FIG. 10 is a schematic diagram illustrating the configurations of portions around a through electrode and an alignment mark part in a semiconductor chip according to a third embodiment.

In the following, a semiconductor chip according to a third embodiment will be described with reference to FIG. 10. FIG. 10 is a plan view illustrating the configurations of portions around through electrode 20 and an alignment mark part of the semiconductor chip according to the third embodiment. However, in FIG. 10, an insulating layer formed on the surface of semiconductor substrate 10 is not deposited in order to clarify the configuration of the chip.

In the third embodiment, the configurations of through electrode 20 and the alignment mark part forming alignment mark 47 are the same as the configurations in the semiconductor chip according to the first embodiment. Insulating films 30 and 50 surround through electrode 20 or alignment mark part 40. In this embodiment, insulating films 30 and 50 form a side wall that makes contact with through electrode 20 or alignment mark part 40 (also see FIG. 13B). Also in this case, insulating film 50 that forms an insulating separator can prevent metal atoms from diffusing out of metal material forming alignment mark part 40.

Figure 11:
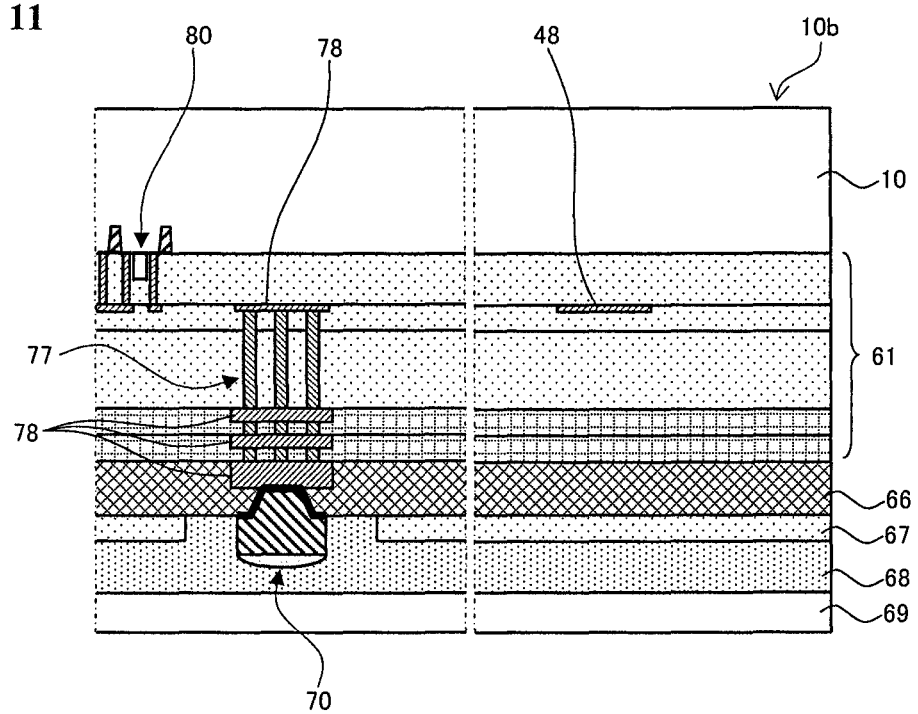
FIG. 11 is a diagram illustrating a step of the process steps of fabricating the semiconductor chip according to the third embodiment.

Next, a method for fabricating the semiconductor chip according to the third embodiment will be described. First, as similar to the first embodiment, semiconductor substrate 10 is prepared. Here, the processes shown in FIG. 4A to FIG. 4C, that is, the processes for forming an insulating film in a ring on first surface 10a of semiconductor substrate 10 are not performed. As shown in FIGS. 5A and 5B, functional element 80, plug 77, bump electrode 70, and so on are then formed (also see FIG. 11). Subsequently, support 69 is attached on the surface of bump electrode 70 and insulating layer 67 through intermediate layer 68 in order to process second surface 10b of semiconductor substrate 10. In this configuration, as similar to the first embodiment, etching stopper layer 48 is formed in interlayer insulating layer 61. Thus, a chip shown in FIG. 11 can be obtained.

Figure 12A:
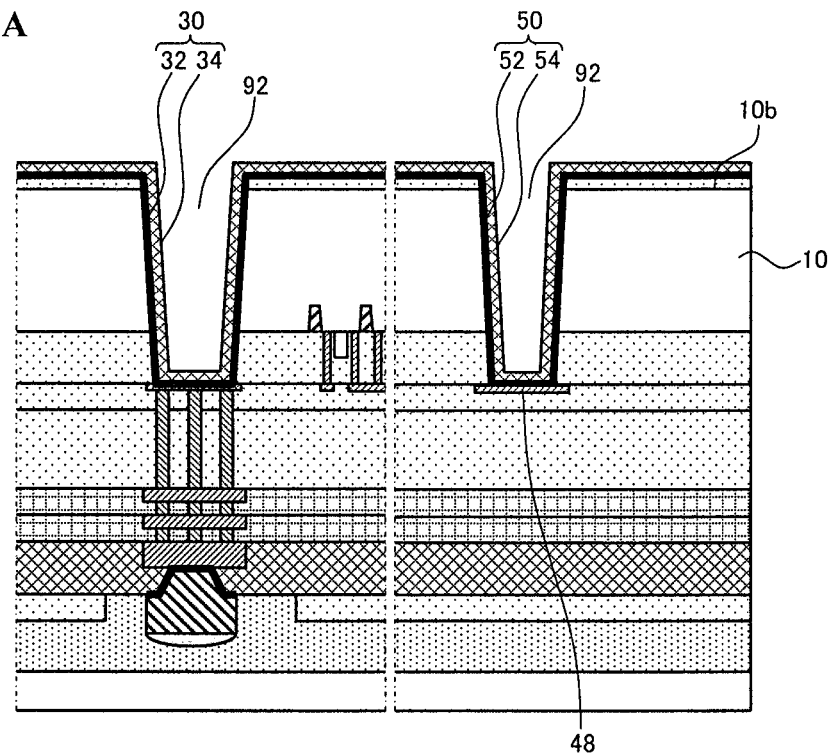
FIGS. 12A and 12B are a diagrams illustrating steps performed subsequent to FIG. 11.

Subsequently, as shown in FIG. 12A, hole 92 for the through electrode and the alignment mark part is formed on second surface 10b of semiconductor substrate 10. Subsequently, insulating films 30 and 50 are formed on the bottom face and side wall of hole 92. In this formation, hole 92 may be formed after forming an insulating layer made of silicon nitride, for example, on second surface 10b of semiconductor substrate 10. Preferably, the depth of hole 92 penetrates semiconductor substrate 10. In this formation, the depth of hole 92 is determined by etching stopper layer 48.

Figure 12B:
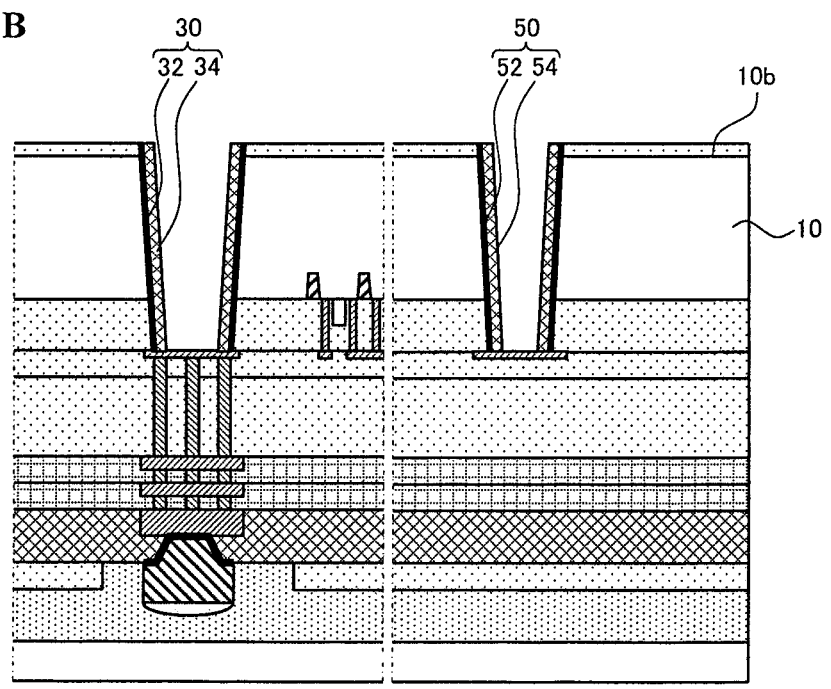

Subsequently, silicon nitride films 32 and 52 and silicon oxide films 34 and 54 are formed on the bottom face and side face of hole 92. In this manner, insulating films 30 and 50 formed of silicon nitride films 32 and 52 and silicon oxide films 34 and 54 are formed. Subsequently, extra silicon oxide films 34 and 54 and/or silicon nitride films 32 and 52 on second surface 10b of semiconductor substrate 10 are removed by an etch back process, as necessary (see FIG. 12B). In this removal, preferably, silicon nitride films 32 and 52 in a predetermined thickness are left on second surface 10b of semiconductor substrate 10.

Figure 13A:
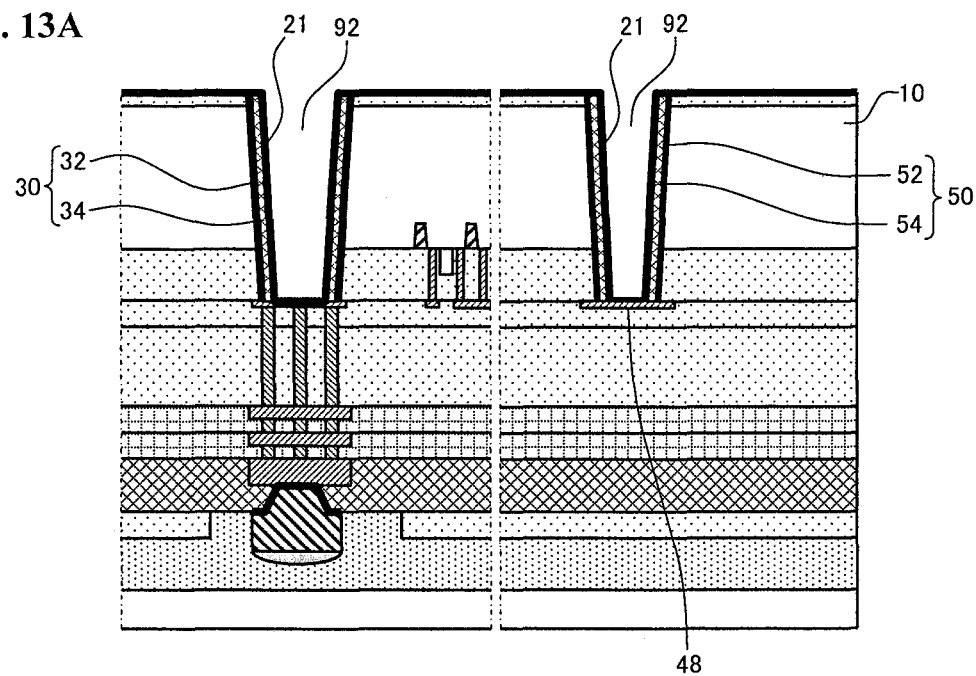
FIGS. 13A and 13B are diagrams illustrating steps performed subsequent to FIG. 12B.

As shown in FIG. 13A, seed layers 21 and 41 that form a part of the through electrode and the alignment mark part are formed on the surfaces of silicon oxide films 34 and 54 in hole 92. Seed layers 21 and 41 can be formed of a Cu/Ti layer, for example. Seed layers 21 and 41 can be formed by sputtering, for example.

Figure 13B:
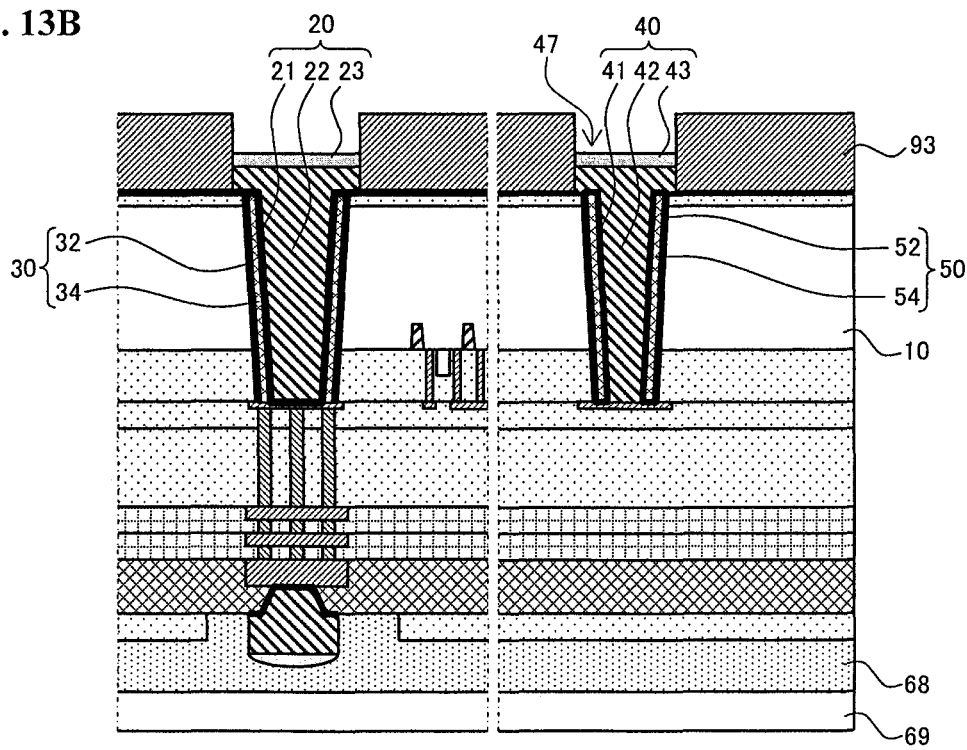

Subsequently, as shown in FIG. 13B, hole 92 is buried with metal materials 22 and 42, and through electrode 20 and alignment mark part 40 are formed. More specifically, first, resist 93 for shaping the through electrode and the alignment mark part in a predetermined shape is formed on semiconductor substrate 10. Subsequently, metal materials 22 and 42 are formed in hole 92 by electroplating, for example. For metal materials 22 and 42, copper, for example, can be used. Here, hole 92 was buried with copper, and metal films 23 and 43 were formed on the surface of copper. For metal films 23 and 43, Au/Ni, for example, can be used, and metal films 23 and 43 can be formed by electroplating. In this manner, through electrode 20 or alignment mark part 40, formed of seed layers 21 and 41, metal materials 22 and 42 and metal films 23 and 43, is formed.

As described above, preferably, through electrode 20 and alignment mark part 40 are made of the same metal material. In this case, through electrode 20 and alignment mark part 40 can be formed at the same time by the same process steps.

Subsequently, resist 93 and unnecessary seed layers 21 and 41 are removed, and intermediate layer 68 and support 69 are removed, so that it is possible to fabricate the semiconductor chip according to the third embodiment.

Figure 14A:
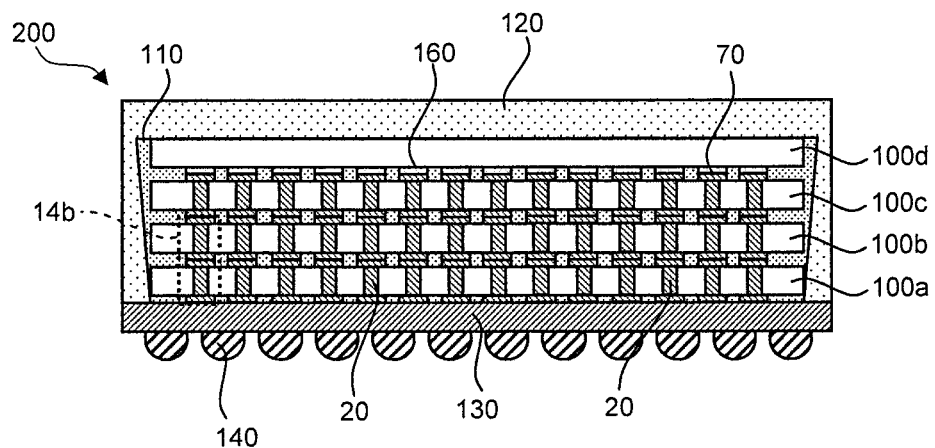
FIG. 14A is a schematic cross sectional view illustrating a semiconductor device using a semiconductor chip according to an embodiment of the present invention.
Figure 14B:
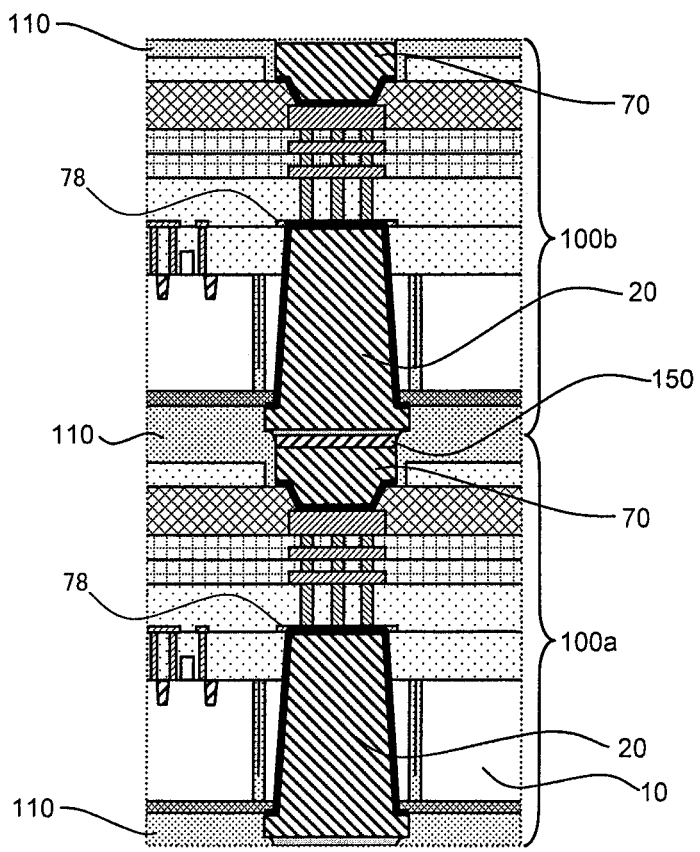
FIG. 14B is an enlarged diagram illustrating region 14b in FIG. 14A.

Next, a semiconductor device including the aforementioned semiconductor chips stacked on each other will be described. FIG. 14A shows semiconductor device 200 having four semiconductor chips 100a to 100d stacked on each other. FIG. 14B is an enlarged diagram illustrating region 14b in FIG. 14A.

As shown in FIG. 14A, semiconductor chips 100a to 100d are stacked on each other. First, second semiconductor chip 100b is mounted on first semiconductor chip 100a. In this mounting, second semiconductor chip 100b is stacked on first semiconductor chip 100a while aligning second semiconductor chip 100b using conductive member 40 exposed in the surface of semiconductor substrate 10 in first semiconductor chip 100a. Thus, bump electrode 70 of first semiconductor chip 100a is joined to through electrode 20 of second semiconductor chip 100b through a conductive joining material, solder 150, for example.

First semiconductor chip 100a and second semiconductor chip 100b are then heated at the melting point of solder 150, or more, at a temperature of about 300° C., for example, for reflowing solder 150, while pressing first semiconductor chip 100a against second semiconductor chip 100b at a constant pressure. As described above, through electrodes 20 of semiconductor chips 100a and 100b are electrically connected to each other, and wiring layers 78 of semiconductor chips 100a and 100b are also electrically connected to each other. A pressure (load) applied in joining the chips to each other may be applied to the extent that the pressure does not affect internal structures formed in semiconductor chips 100a and 100b.

It is noted that in joining semiconductor chips 100a and 100b to each other, conductor 40 used for the alignment mark of first semiconductor chip 100a is not electrically connected to second semiconductor chip 100b.

Similarly, third semiconductor chip 100c is mounted on second semiconductor chip 100b, and then fourth semiconductor chip 100d is mounted on third semiconductor chip 100c.

Subsequently, underfill resin 110 is filled between semiconductor chips 100a to 100d. Subsequently, through electrode 20 for an external terminal formed on semiconductor chip 100a of the lowermost level is connected to package substrate 130. Subsequently, ball grid array (BGA) 140 formed of mold resin 120 and a solder ball is formed. Thus, semiconductor device 200 shown in FIG. 14A is completed.

The uppermost semiconductor chip 100d may receive signals and power supplied from terminal 70 of semiconductor chip 100c through terminal 160 of chip 100d of semiconductor chip 100c. It is not necessary for the uppermost semiconductor chip 100d to supply signals supplied from terminal 70 of semiconductor chip 100c to the other semiconductor chips. Therefore, through electrode 20 does not need to be formed in uppermost semiconductor chip 100d. As described above, in the case where through electrode 20 is not formed in semiconductor chip 100d, it is unnecessary to reduce the thickness of the chip to facilitate the formation of through electrode 20. Therefore, the thickness of uppermost semiconductor chip 100d can be made thicker than the thicknesses of other semiconductor chips 100a to 100c. As a result, it is possible to suppress the deformation of the chips caused by thermal stress in fabricating semiconductor device 200, more specifically, in mounting uppermost semiconductor chip 100d on semiconductor chip 100c.

It is noted that in FIG. 14A, semiconductor device 200 is taken as an example, having four semiconductor chips 100a to 100d stacked on each other. However, the present invention is applicable to semiconductor devices having two semiconductor chips or more stacked on each other. As described above, also in semiconductor devices having semiconductor chips stacked on each other, except for semiconductor devices having four semiconductor chips stacked on each other, the foregoing configurations are applicable. Namely, in such semiconductor devices, the thickness of a semiconductor chip stacked at the uppermost level can be increased more than the thicknesses of the other semiconductor chips without forming through electrodes and terminals in the semiconductor chip stacked at the uppermost level.

From a viewpoint that all the semiconductor chips can be formed in a similar configuration, the uppermost semiconductor chip may have through electrodes and terminals that are similar to the other semiconductor chips. The foregoing advantages can also be obtained by applying the invention of the present application to such semiconductor devices.

While preferred embodiments of the present invention have been described using specific terms, such description is for illustrative purposes only, and it is to be understood that changes and variations may be made without departing from the spirit or scope of the following claims.

What is claimed is:

1. A semiconductor device, comprising:
    a semiconductor substrate having a first surface and a second surface located opposite to each other in a thickness direction;
    a semiconductor element formed on the first surface of the semiconductor substrate;
    a through electrode penetrating the semiconductor substrate from the first surface to the second surface and electrically connected to the semiconductor element, the through electrode having a first shape in plan view; and
    a conductor penetrating the semiconductor substrate from the first surface to the second surface and not electrically connected to the semiconductor element, the conductor having a second shape in plan view,
    wherein the first shape is different from the second shape.

2. The semiconductor device according to claim 1, wherein the second shape of the conductor is a polygon.

3. The semiconductor device according to claim 1, wherein the second shape of the conductor is an L-shape.

4. The semiconductor device according to claim 1, wherein the conductor has a metal material that is the same as a metal material of the through electrode.

5. The semiconductor device according to claim 1, further comprising:
    an insulating separator penetrating the semiconductor substrate from the first surface to the second surface and surrounding the conductor.

6. The semiconductor device according to claim 5, wherein the insulating separator is disposed apart from the conductor.

7. The semiconductor device according to claim 5, wherein the insulating separator is formed of a closed curve in a plane parallel with the first and second surface.

8. The semiconductor device according to claim 5, wherein the insulating separator directly makes contact with the conductor.

9. The semiconductor device according to claim 5, wherein the insulating separator includes a silicon nitride film.

10. The semiconductor device according to claim 5, wherein the insulating separator contains polysilicon.

11. A semiconductor device, comprising:
    a plurality of semiconductor chips stacked on each other, each of the plurality of semiconductor chips having a semiconductor substrate and a wiring layer;
    a through electrode penetrating the semiconductor substrate in a thickness direction and which are electrically connected to each other between the semiconductor chips adjacent to each other, the through electrode having a first shape in plan view; and a conductor penetrating the semiconductor substrate in the thickness direction and which are not electrically connected between the other semiconductor chips, the conductor having a second shape in plan view, wherein the first shape is different from the second shape.

12. The semiconductor device according to claim 11, wherein the second shape of the conductor is a polygon.

13. The semiconductor device according to claim 11, wherein the second shape of the conductor is an L-shape.

14. The semiconductor device according to claim 11, wherein the conductor has a metal material that is the same as a metal material of the through electrode.

15. The semiconductor device according to claim 11, further comprising:

an insulating separator penetrating the semiconductor substrate in the thickness direction and surrounding the conductor.

16. The semiconductor device according to claim 15, wherein the insulating separator is disposed apart from the conductor.

17. The semiconductor device according to claim 15, wherein the insulating separator is formed of a closed curve in a plane parallel with a surface of the semiconductor substrate.

18. The semiconductor device according to claim 15, wherein the insulating separator directly makes contact with the conductor.

19. The semiconductor device according to claim 15, wherein the insulating separator includes a silicon nitride film.

20. The semiconductor device according to claim 15, wherein the insulating separator contains polysilicon.

* * * * *